(12) United States Patent
Kong et al.

(10) Patent No.: US 10,243,567 B2
(45) Date of Patent: Mar. 26, 2019

(54) FLIP-FLOP AND DRIVING METHOD THEREOF

(71) Applicant: Research & Business Foundation Sungkyunkwan University, Suwon-si (KR)

(72) Inventors: Bai Sun Kong, Seoul (KR); Ji Hoon Park, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/010,758

(22) Filed: Jun. 18, 2018

(65) Prior Publication Data

US 2018/0367148 A1    Dec. 20, 2018

(30) Foreign Application Priority Data

Jun. 16, 2017    (KR) ................ 10-2017-0076941

(51) Int. Cl.
*H03K 19/177*  (2006.01)
*H03K 19/00*   (2006.01)
*H03K 5/135*   (2006.01)
*H03K 3/037*   (2006.01)
*H03K 17/687*  (2006.01)

(52) U.S. Cl.
CPC ..... *H03K 19/17784* (2013.01); *H03K 3/0375* (2013.01); *H03K 5/135* (2013.01); *H03K 17/6871* (2013.01); *H03K 19/0016* (2013.01)

(58) Field of Classification Search
None
See application file for complete search history.

(56) References Cited

U.S. PATENT DOCUMENTS

| | | | |
|---|---|---|---|
| 8,947,146 B2 * | 2/2015 | Lee ........................ | H03K 3/012 327/211 |
| 2010/0207684 A1 * | 8/2010 | Park ....................... | H02M 3/07 327/536 |
| 2012/0268182 A1 * | 10/2012 | Lee .................. | H03K 3/356121 327/199 |
| 2014/0091870 A1 * | 4/2014 | Morris ................ | H03K 3/0231 331/111 |
| 2014/0152342 A1 * | 6/2014 | Kong ............. | H03K 19/018528 326/33 |

\* cited by examiner

*Primary Examiner* — Jany Richardson
(74) *Attorney, Agent, or Firm* — NSIP Law (57) ABSTRACT

A flip-flop includes a conditional boosting stage, a pulse generator and a latch. The conditional boosting stage includes a boosting capacitor, and is configured to precharge the boosting capacitor in accordance with a previous output signal and boost a node connected to the boosting capacitor upon a level the previous output signal being different from a level of a current input signal. The pulse generator is configured to generate a pulsed signal in accordance with transitions of a clock signal. The latch configured is to latch the current input signal to a current output signal in accordance with the pulsed signal.

13 Claims, 8 Drawing Sheets

TABLE 1

DATA-DEPENDENT PRESETTING AND BOOSTING

| | input (D) | output (Q) | boosting node (N) | boosting node (NB) |
|---|---|---|---|---|
| output-dependent presetting | - | VSS | VSS | VDD |
| | | VDD | VDD | VSS |
| input-dependent boosting | D=VDD | VSS | VSS → -VDD | VDD → VSS |
| | | VDD | VSS | VDD |
| | D=VSS | VSS | VDD | VSS |
| | | VDD | VDD → VSS | VSS → -VDD |

TABLE II
FLIP-FLOP PERFORMANCE COMPARISON AT 0.5V

| | S²CFF | ACFF | TCFF | SAFF | STFF-D | CBFF | CBFF-SP |
|---|---|---|---|---|---|---|---|
| Structure | Single-end | Single-end | Single-end | Differential | Differential | Differential | Differential |
| Device count (EA) | 24 | 22 | 21 | 26 | 32 | 43 | 34.75 |
| layout area ($\mu m^2$) | 20 | 26 | 24 | 23 | 27 | 42 | 37 |
| Setup time (ns) | 2.86 | 5.92 | 8.4 | -0.16 | -2.59 | -2.46 | -3.45 |
| Hold time (ns) | -0.2 | 2.87 | 2.94 | 1.85 | 3.51 | 3.16 | 4.17 |
| Pulse width (ns) | - | - | - | - | - | 4.09 | 5.98 |
| CQ latency (ns, TT/27°) | 3.6 | 3.27 | 8.59 | 3.8 | 5.4 | 3.49 | 4.43 |
| DQ latency (ns, TT/27°) | 6.32 | 9.6 | 16.9 | 3.7 | 2.8 | 1.03 | 1.05 |
| σ of DQ latency (ns, TT/27°) | 0.73 | 0.68 | 3.87 | 0.32 | 0.56 | 0.082 | 0.083 |
| Energy (fJ, α=25%, TT/27°) | 1.98 | 1.83 | 1.43 | 3.63 | 4.3 | 6.21 | 4.25 |
| EDP (yJs, α=25%, TT/27°) | 12.5 | 17.6 | 24.2 | 13.4 | 12.1 | 6.36 | 4.44 |
| σ of EDP (yJs, α=25%) | 1.5 | 3.17 | 5.75 | 1.18 | 4.11 | 0.54 | 0.38 |

FIG. 14

FLIP-FLOP AND DRIVING METHOD THEREOF

CROSS-REFERENCE TO RELATED APPLICATIONS

This application claims the benefit under 35 USC 119(a) of Korean Patent Application No. 10-2017-0076941 filed on Jun. 16, 2017, in the Korean Intellectual Property Office, the entire disclosure of which is incorporated herein by reference for all purposes.

BACKGROUND

1. Field

The present disclosure relates to a flip-flop and a driving method thereof.

2. Description of the Related Art

An energy efficiency computation is essential for portable electronic apparatuses to ensure a long driving time. Voltage scaling is one of the most effective approaches to minimize power consumption of CMOS digital circuits.

However, excessive voltage scaling such as subthreshold computation may cause a problem of severe speed lowering.

A capacitive boosting technique may be a solution for overcoming the problems caused by the excessive voltage scaling. The capacitive boosting technique may boost a gate-source voltage of some MOS transistors to be a supply voltage or higher or a ground voltage or lower. A driving capability of a transistor enhanced thereby may reduce latency and sensitivity due to a process error.

However, there is a problem in that such a capacitive boosting technique performs a bootstrapping operation for all input transitions so that power consumption is significant.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a flip-flop includes a conditional boosting stage, a pulse generator and a latch. The conditional boosting stage includes a boosting capacitor, and is configured to pre-charge the boosting capacitor in accordance with a previous output signal and boost a node connected to the boosting capacitor upon a level of the previous output signal being different from a level of a current input signal. The pulse generator is configured to generate a pulsed signal in accordance with transitions of a clock signal. The latch configured is to latch the current input signal to a current output signal in accordance with the pulsed signal.

The conditional boosting stage may further include a first transistor, a second transistor, a third transistor, and a fourth transistor. The first transistor includes a gate terminal, configured to receive the previous output signal, and one end connected to one end of the boosting capacitor. The second transistor includes a gate terminal, configured to receive an inverted previous output signal, and one end connected to the other end of the boosting capacitor. The third transistor includes a gate terminal, connected to one end of the boosting capacitor, one end connected to a first power supply voltage, and the other end connected to the other end of the boosting capacitor. The fourth transistor includes a gate terminal, connected to the other end of the boosting capacitor, one end connected to the first power supply voltage, and the other end connected to one end of the boosting capacitor.

The conditional boosting stage may further include a fifth transistor and a sixth transistor. The fifth transistor includes a gate terminal, configured to receive the current input signal, and one end connected to one end of the boosting capacitor. The sixth transistor includes a gate terminal, configured to receive an inverted current input signal, and one end connected to the other end of the boosting capacitor.

The the conditional boosting stage may further include a seventh transistor and an eighth transistor. The seventh transistor includes a gate terminal, configured to receive a clock signal, one end is connected to the other end of the first transistor, and the other end is connected to a second power supply voltage. The eighth transistor includes a gate terminal, configured to receive the pulsed signal, one end connected to the other end of the fifth transistor, and the other end connected to the first power supply voltage.

The conditional boosting stage may further include a ninth transistor, a tenth transistor, an eleventh transistor, a twelfth transistor, and a first inverter. The ninth transistor includes a gate terminal, configured to receive the current input signal, and one end connected to the other end of the boosting capacitor. The tenth transistor includes a gate terminal, configured to receive the pulsed signal, and one end connected to the other end of the ninth transistor. The eleventh transistor includes a gate terminal, configured to receive the clock signal, one end connected to the other end of the tenth transistor and the other end connected to the second power supply voltage. The twelfth transistor has one end connected to the other end of the tenth transistor and the other end connected to the second power supply voltage. The first inverter has one end connected to the other end of the tenth transistor and the other end connected to a gate terminal of the twelfth transistor.

The conditional boosting stage may further include a thirteenth transistor, a fourteenth transistor, a fifteenth transistor, a sixteenth transistor, and a second inverter. The thirteenth transistor includes a gate terminal, configured to receive the inverted current input signal, and one end connected to one end of the boosting capacitor. The fourteenth transistor includes a gate terminal, configured to receive the pulsed signal, and one end connected to the other end of the thirteenth transistor. The fifteenth transistor includes a gate terminal, configured to receive the clock signal, one end connected to the other end of the fourteenth transistor and the other end connected to the second power supply voltage. The sixteenth transistor has one end connected to the other end of the fourteenth transistor and the other end connected to the second power supply voltage. The second inverter has one end connected to the other end of the fourteenth transistor and the other end connected to a gate terminal of the sixteenth transistor.

The latch may include a seventeenth transistor, an eighteenth transistor, a nineteenth transistor, and a twentieth transistor. The seventeenth transistor includes a gate terminal, connected to the other end of the tenth transistor, and one end connected to the second power supply voltage. The eighteenth transistor includes a gate terminal, connected to the gate terminal of the sixteenth transistor, one end connected to the other end of the seventeenth transistor, and the other end connected to the first power supply voltage. The nineteenth transistor includes a gate terminal, connected to the other end of the fourteenth transistor, and one end connected to the second power supply voltage. The twentieth transistor includes a gate terminal, connected to the gate terminal of the twelfth transistor, one end connected to the other end of the nineteenth transistor, and the other end connected to the first power supply voltage.

The latch further includes a twenty-first transistor, a twenty-second transistor, a twenty-third transistor, and a twenty-fourth transistor. The twenty-first transistor includes a gate terminal, connected to the gate terminal of the sixteenth transistor, and one end connected to the second power supply voltage. The twenty-second transistor includes a gate terminal, connected to the other end of the nineteenth transistor, one end connected to the other end of the twenty-first transistor, and the other end connected to the other end of the seventeenth transistor. The twenty-third transistor includes a gate terminal, connected to the other end of the nineteenth transistor, and one end connected to the other end of the twenty-second transistor. The twenty-fourth transistor includes a gate terminal, connected to the other end of the tenth transistor, one end connected to the other end of the twenty-third transistor, and the other end connected to the first power supply voltage.

The latch may further include a twenty-fifth transistor, a twenty-sixth transistor, a twenty-seventh transistor, and a twenty-eighth transistor. The twenty-fifth transistor includes a gate terminal, connected to the gate terminal of the twelfth transistor, and one end connected to the second power supply voltage. The twenty-sixth transistor includes a gate terminal, connected to the other end of the seventeenth transistor, one end connected to the other end of the twenty-fifth transistor, and the other end connected to the other end of the nineteenth transistor. The twenty-seventh transistor includes a gate terminal, connected to the other end of the seventeenth transistor, and one end connected to the other end of the nineteenth transistor. The twenty-eighth transistor includes a gate terminal, connected to the other end of the fourteenth transistor, one end connected to the other end of the twenty-seventh transistor, and the other end connected to the first power supply voltage.

The pulse generator may include a third inverter, a fourth inverter, a fifth inverter, a twenty-ninth transistor, and a sixth inverter. The third inverter has one end configured to receive the clock signal. The fourth inverter has one end connected to the other end of the third inverter. The fifth inverter has one end connected to the other end of the fourth inverter. The twenty-ninth transistor includes a gate terminal, connected to the other end of the fifth inverter, and one end connected to the second power supply voltage. The sixth inverter has one end connected to the other end of the twenty-ninth transistor and the pulsed signal output through the other end.

The pulse generator may further include a thirtieth transistor and a thirty-first transistor. The thirtieth transistor includes a gate terminal, connected to the other end of the fifth inverter, one end connected to the other end of the third inverter, and the other end connected to one end of the sixth inverter. The thirty-first transistor includes a gate terminal, connected to the other end of the fourth inverter, one end connected to the other end of the third inverter, and the other end connected to one end of the sixth inverter.

In another general aspect, a driving method of a flip-flop, includes pre-charging a boosting capacitor in accordance with a previous output signal; boosting a node connected to the boosting capacitor upon a level of the previous output signal being different from a level of a current input signal; generating a pulsed signal in accordance with transitions of a clock signal; and latching the current input signal to a current output signal in accordance with the pulsed signal.

A node connected to the boosting capacitor may not be boosted when the level of the previous output signal is the same as the level of a current input signal.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION OF THE PREFERRED EMBODIMENT

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
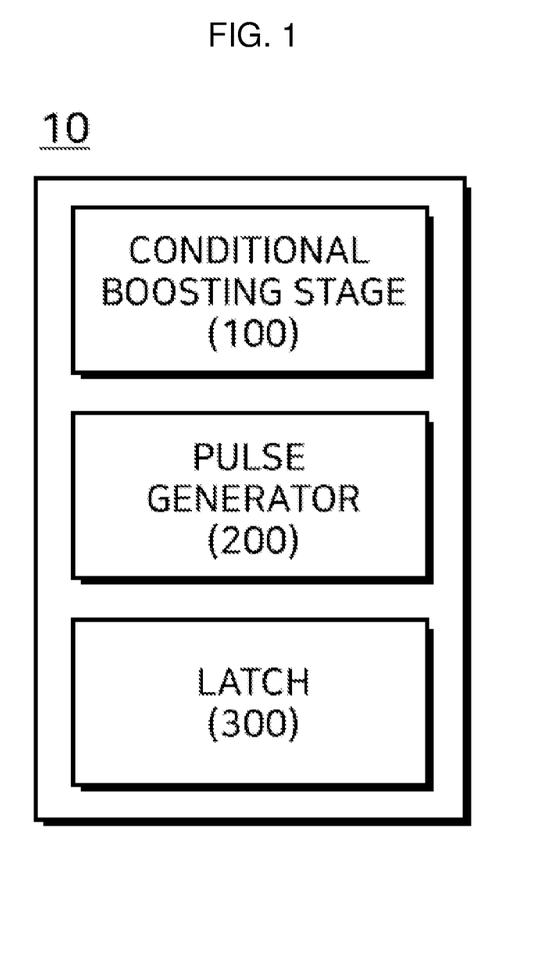
FIG. 1 is a view of an example of a flip-flop.

FIG. 1 is an example of a flip-flop according to the present disclosure.

Referring to FIG. 1, a flip-flop 10 of the present disclosure includes a conditional boosting stage 100, a pulse generator 200, and a latch 300.

The conditional boosting stage 100 includes a boosting capacitor and pre-charges the boosting capacitor in accordance with a previous output signal and boosts a node connected to the boosting capacitor when a level of a previous output signal is different from a level of a current input signal. The conditional boosting stage 100 will be described in more detail with reference to FIGS. 2, 5, 6, 7, and 8.

The pulse generator 200 generates a pulsed signal in accordance with transition of a clock signal. The pulse generator 200 will be described in more detail with reference to FIGS. 4 and 8.

The latch 300 latches the current input signal to a current output signal in accordance with the pulsed signal. The latch 300 will be described in more detail with reference to FIGS. 3 and 8.

The flip-flop 10 according to the present disclosure may be referred to as a conditional boosting flip-flop (CBFF).

Figure 2:
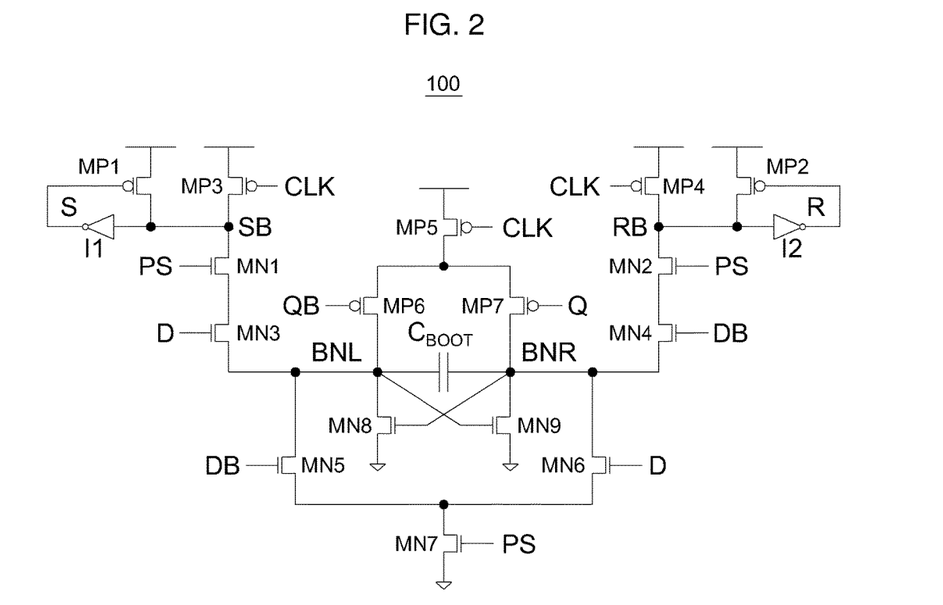
FIG. 2 is a view of an example of a conditional boosting stage.

FIG. 2 is a view for explaining a conditional boosting stage according to the present disclosure.

Referring to FIG. 2, a conditional boosting stage 100 according to the present disclosure includes a boosting capacitor $C_{BOOT}$, first to sixteenth transistors MP7, MP6, MN8, MN4, MN6, MN5, MP5, MN7, MN3, MN1, MP3, MP1, MN4, MN2, MP4, and MP2, a first inverter I1, and a second inverter I2.

A previous output signal Q is applied to a gate terminal of the first transistor MP7 and one end of the first transistor MP7 is connected to one end of the boosting capacitor $C_{BOOT}$.

An inverted previous output signal QB is applied to a gate terminal of the second transistor MP6 and one end of the second transistor MP6 is connected to the other end of the boosting capacitor $C_{BOOT}$.

A gate terminal of the third transistor MN8 is connected to one end of the boosting capacitor $C_{BOOT}$, one end is connected to a first power supply voltage VSS, and the other end is connected to the other end of the boosting capacitor $C_{BOOT}$.

A gate terminal of the fourth transistor MN9 is connected to the other end of the boosting capacitor $C_{BOOT}$, one end is connected to the first power supply voltage VSS, and the other end is connected to one end of the boosting capacitor $C_{BOOT}$.

A current input signal D is applied to a gate terminal of the fifth transistor MN6 and one end of the fifth transistor MN6 is connected to one end of the boosting capacitor $C_{BOOT}$.

An inverted current input signal DB is applied to a gate terminal of the sixth transistor MN5 and one end of the sixth transistor MN5 is connected to the other end of the boosting capacitor $C_{BOOT}$.

A clock signal CLK is applied to a gate terminal of the seventh transistor MP5 and one end of the seventh transistor MP5 is connected to the other end of the first transistor MP7 and the other end is connected to a second power supply voltage VDD.

A pulsed signal PS is applied to a gate terminal of the eighth transistor MN7 and one end of the eighth transistor MN7 is connected to the other end of the fifth transistor MN6 and the other end is connected to the first power supply voltage VSS.

A current input signal D is applied to a gate terminal of the ninth transistor MN3 and one end of the ninth transistor MN3 is connected to the other end of the boosting capacitor $C_{BOOT}$.

A pulsed signal PS is applied to a gate terminal of the tenth transistor MN1 and one end of the tenth transistor MN1 is connected to the other end of the ninth transistor MN3.

A clock signal CLK is applied to a gate terminal of the eleventh transistor MP3, one end of the eleventh transistor MP3 is connected to the other end of the tenth transistor MN1, and the other end is connected to the second power supply voltage VDD.

One end of the twelfth transistor MP1 is connected to the other end of the tenth transistor MN1 and the other end is connected to the second power supply voltage VDD.

One end of the first inverter I1 is connected to the other end of the tenth transistor MN1 and the other end is connected to the gate terminal of the twelfth transistor MP1.

An inverted current input signal DB is applied to a gate terminal of the thirteenth transistor MN4 and one end of the thirteenth transistor MN4 is connected to one end of the boosting capacitor $C_{BOOT}$.

A pulsed signal PS is applied to a gate terminal of the fourteenth transistor MN2 and one end of the fourteenth transistor MN2 is connected to the other end of the thirteenth transistor MN4.

A clock signal CLK is applied to a gate terminal of the fifteenth transistor MP4, one end of the fifteenth transistor MP4 is connected to the other end of the fourteenth transistor MN2 and the other end is connected to the second power supply voltage VDD.

One end of the sixteenth transistor MP2 is connected to the other end of the fourteenth transistor MN2 and the other end is connected to the second power supply voltage VDD.

One end of the second inverter I2 is connected to the other end of the fourteenth transistor MN2 and the other end is connected to a gate terminal of the sixteenth transistor MP2.

The conditional boosting stage 100 is a conditional boosting differential stage and the transistors MP5, MP6, and MP7 and the transistors MN8 and MN9 may be used to implement an output-dependent presetting. In contrast, the transistors MN5, MN6, and MN7 may be used to implement an input-dependent boosting together with the boosting capacitor $C_{BOOT}$. The output-dependent presetting and the input-dependent boosting will be described below with reference to FIGS. 5 and 6.

Figure 3:
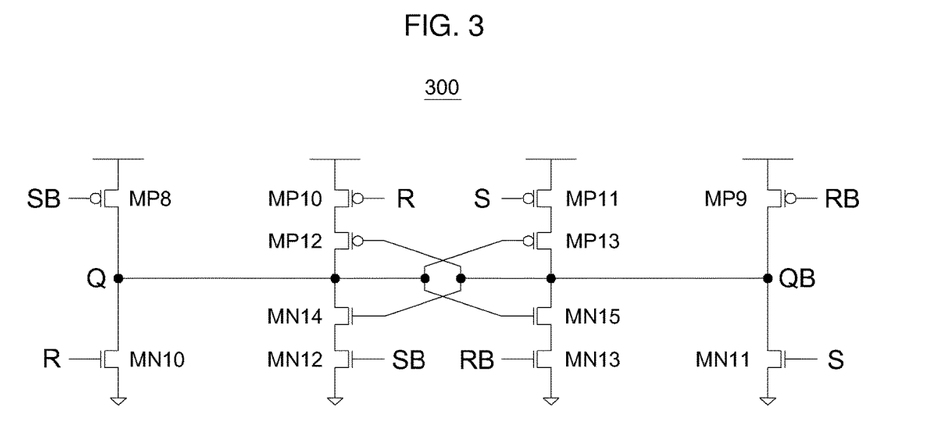
FIG. 3 is a view of an example of a latch.

FIG. 3 is an example of a latch according to the present disclosure.

Referring to FIG. 3, the latch 300 according to the present disclosure may include seventeenth to twenty-eighth transistors MP8, MN10, MP9, MN11, MP19, MP12, MN14, MN12, MP11, MP13, MN15, and MN13.

A gate terminal of the seventeenth transistor MP8 is connected to the other end of the tenth transistor MN1 and one end is connected to the second power supply voltage VDD.

A gate terminal of the eighteenth transistor MN10 is connected to the gate terminal of the sixteenth transistor MP2, one end of the eighteenth transistor MN10 is connected to the other end of the seventeenth transistor MP8, and the other end is connected to the first power supply voltage VSS.

A gate terminal of the nineteenth transistor MP9 is connected to the other end of the fourteenth transistor MN2 and one end is connected to the second power supply voltage VDD.

A gate terminal of the twentieth transistor MN11 is connected to the gate terminal of the twelfth transistor MP1, one end is connected to the other end of the nineteenth transistor MP9, and the other end is connected to the first power supply voltage VSS.

A gate terminal of the twenty-first transistor MP10 is connected to the gate terminal of the sixteenth transistor MP2 and one end is connected to the second power supply voltage VDD.

A gate terminal of the twenty-second transistor MP12 is connected to the other end of the nineteenth transistor MP9, one end is connected to the other end of the twenty-first transistor MP10, and the other end is connected to the other end of the seventeenth transistor MP8.

A gate terminal of the twenty-third transistor MN14 is connected to the other end of the nineteenth transistor MP9 and one end is connected to the other end of the twenty-second transistor MP12.

A gate terminal of the twenty-fourth transistor MN12 is connected to the other end of the tenth transistor MN1, one end of the twenty-fourth transistor MN12 is connected to the other end of the twenty-third transistor MN14, and the other end is connected to the first power supply voltage VSS.

A gate terminal of the twenty-fifth transistor MP11 is connected to the gate terminal of the twelfth transistor MP1 and one end is connected to the second power supply voltage VDD.

A gate terminal of the twenty-sixth transistor MP13 is connected to the other end of the seventeenth transistor MP8, one end is connected to the other end of the twenty-fifth transistor MP11, and the other end is connected to the other end of the nineteenth transistor MP9.

A gate terminal of the twenty-seventh transistor MN15 is connected to the other end of the seventeenth transistor MP8 and one end is connected to the other end of the nineteenth transistor MP9.

A gate terminal of the twenty-eighth transistor MN13 is connected to the other end of the fourteenth transistor MN2, one end of the twenty-eighth transistor MN13 is connected to the other end of the twenty-seventh transistor MN15, and the other end is connected to the first power supply voltage VSS.

The latch 300 may be a symmetric latch.

Figure 4:
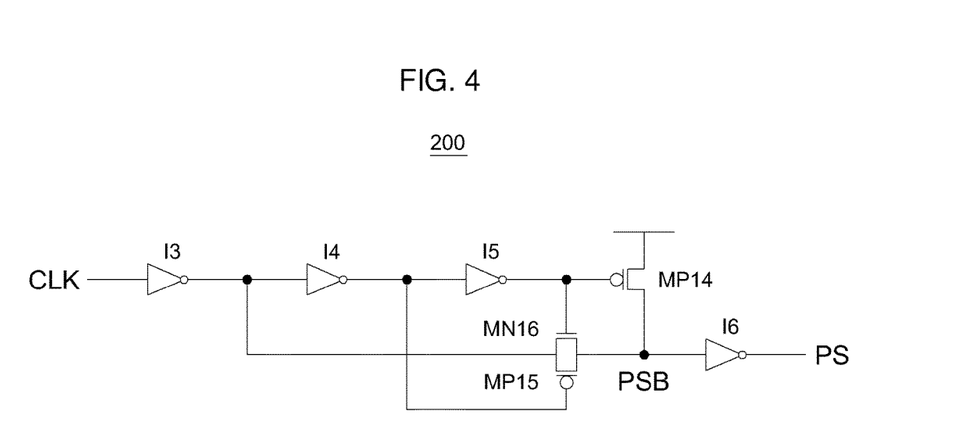
FIG. 4 is a view of an example of a pulse generator.

FIG. 4 is an example of a pulse generator according to the present disclosure.

Referring to FIG. 4, a pulse generator 200 according to the present disclosure may include third to sixth inverters I3, I4, I5, and I6 and twenty-ninth to thirty-first transistors MP14, MP16, and MP15.

A clock signal CLK may be applied to one end of the third inverter I3.

One end of the fourth inverter I4 is connected to the other end of the third inverter I3.

One end of the fifth inverter I5 is connected to the other end of the fourth inverter I4.

A gate terminal of the twenty-ninth transistor MP14 is connected to the other end of the fifth inverter I5 and one end is connected to the second power supply voltage VDD.

One end of the sixth inverter I6 is connected to the other end of the twenty-ninth transistor MP14 and a pulsed signal PS is output through the other end of the sixth inverter I6.

A gate terminal of the thirtieth transistor MN16 is connected to the other end of the fifth inverter I5, one end of the thirtieth transistor MN16 is connected to the other end of the third inverter I3, and the other end is connected to one end of the sixth inverter I6.

A gate terminal of the thirty-first transistor MP15 is connected to the other end of the fourth inverter I4, one end of the thirty-first transistor MN15 is connected to the other end of the third inverter I3, and the other end is connected to one end of the sixth inverter I6.

The pulse generator 200 is an explicit brief pulse generator and drives some transistors of the conditional boosting stage 100 with a pulsed signal PS.

Differently from the pulse generator of the related art, the pulse generator 200 does not include a pMOS keeper and there is no signal contention during a pull-down of the inverted pulsed signal PSB, so that a higher speed and a lower power driving may be achieved.

A role of the pMOS keeper, which is used to maintain a high level logic value of the inverted pulsed signal PSB, is performed by the thirty-first transistor MP15 which is added in parallel to the thirtieth transistor MN16. The thirty-first transistor MP15 helps fast pull-down of the inverted pulsed signal PSB.

At a rising edge of the clock signal CLK, the inverted pulsed signal PSB is quickly discharged by the transistors MN16 and MP15 and the third inverter I3 to make the pulsed signal PS a high level. After the delay of the inverters I4 and I5, the inverted pulsed signal PSB is charged by the twenty-ninth transistor MP14 and thus the pulsed signal PS returns to a low level. A width of the pulsed signal PS is determined by a delay value of the inverters I4 and I5.

When the clock signal CLK is a low level, the inverted pulsed signal PSB is maintained to be a high level by the thirty-first transistor MP15. In this case, the twenty-ninth transistor MP14 is turned off.

According to a measurement evaluation, it was confirmed that energy is reduced up to 9% for the same slew rate and the same pulse width.

Figure 5:
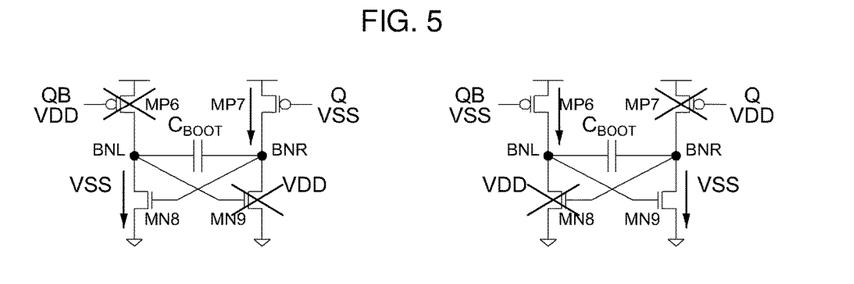
FIG. 5 is an example of a process of pre-charging a boosting capacitor based on a previous output signal.
Figure 6:
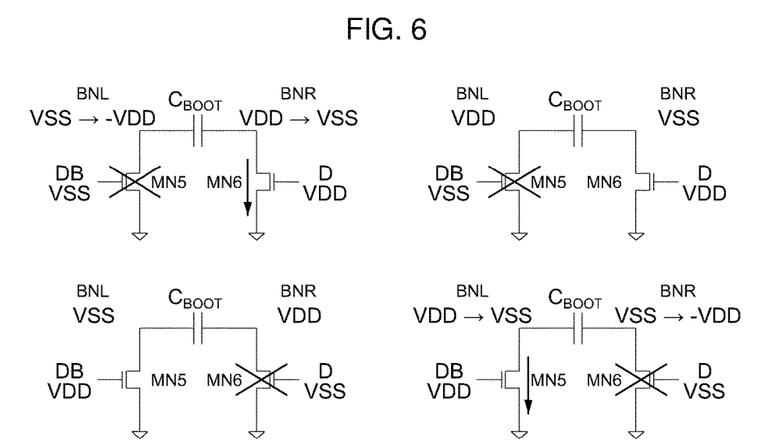
FIG. 6 is an example of a process of boosting a node connected to a boosting capacitor based on a previous output signal and a current input signal.
Figure 7:
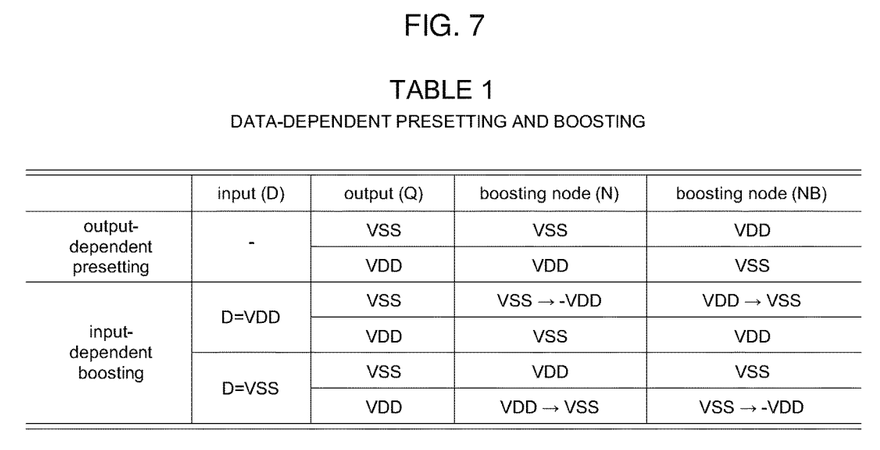
FIG. 7 is an example of a table depicting a boosting condition.

FIG. 5 is an example of a process of pre-charging a boosting capacitor based on a previous output signal, FIG. 6 is an example of a process of boosting a node connected to a boosting capacitor based on a previous output signal and a current input signal, and FIG. 7 is an example of a table depicting a boosting condition.

When FIGS. 5 to 7 are described, for the ease of description, it is assumed that the clock signal CLK is a low level and the pulsed signal PS is a high level. In this case, the seventh transistor MP5 and the eighth transistor MN7 are electrically conducted so that the seventh transistor MP5 and the eighth transistor MN7 are omitted in FIGS. 5 and 6.

In order to implement conditional boosting by the differential flip-flop, four different scenarios for input data capture need to be considered. Four scenarios may be determined by logic states for input and output. Four scenarios will be described as follows:

A first scenario is that with respect to a low level of a previous output signal Q, the boosting of a high level of a current input signal D needs to be triggered for quick capture of incoming data.

A second scenario is that with respect to a low level of a previous output signal Q, it is not required to capture an input, so that the boosting of a low level of a current input signal D should not be triggered.

A third scenario is that with respect to a high level of a previous output signal Q, it is required to quickly capture incoming data, boosting of a low level of a current input signal D needs to be triggered.

A fourth scenario is that with respect to a high level of a previous output signal Q, boosting of a high level of a current input signal D should not be triggered.

Such scenarios use a single boosting capacitor $C_{BOOT}$ by a combination of two operation principles to be embedded in a circuit topology.

A first operation principle is that a voltage presetting at both ends of the boosting capacitor $C_{BOOT}$ needs to be determined by data (previous output data) stored at an output side (output-dependent presetting).

A second operation principle is that the boosting operation needs to be conditional to input data (current input signal) given to the flip-flop 10 (input-dependent boosting).

FIGS. 5 and 6 illustrate a conceptual circuit diagram for explaining the above-mentioned principles.

For the first operation principle, preset voltages of capacitor terminals BNL and BNR need to be determined by a previous output signal Q and an inverted previous output signal QB. If the previous output signal Q is a low level and the inverted previous output signal QB is a high level, a node BNL is preset to a low level and a node BNR is preset to a high level (see a left side of FIG. 5). If the previous output signal Q is a high level and the inverted previous output signal QB is a low level, the node BNL is preset to a high level and the node BNR is preset to a low level (see a right side of FIG. 5).

For the second operation principle, the current input signal D needs to be coupled to the node BNR through an nMOS transistor MN6. Further, the inverted current input signal DB needs to be coupled to the node BNL through the nMOS transistor MN5 (see FIG. 6).

For example, when the low level data is stored in the flip-flop 10, the boosting capacitor $C_{BOOT}$ is preset as illustrated at the left side of FIG. 5 and the high level input pulls down the voltage of the node BNR to a ground level and boosts the voltage of the node BNL to a (−)VDD level (see an upper-left side of FIG. 6).

In contrast, the low level input connects the voltage of the node BNL to the ground. However, since the voltage of the node BNL is already preset to VSS, voltage change does not occur in the node BNR and the boosting operation does not occur (see a lower left side of FIG. 6).

As another example, when high level data is stored in the flip-flop 10, the boosting capacitor $C_{BOOT}$ is preset as illustrated in the right side of FIG. 5, the low level input pulls down the voltage of the node BNL to a ground level so that the voltage of the node BNR is boosted to (−)VDD by the capacitive coupling (see a lower right side of FIG. 6).

In contrast, the high level input connects the voltage of the node BNR to the ground. However, since the voltage of the node BNR is already preset to VSS, voltage change does not occur at the node BNL so that the boosting operation does not occur (see an upper right side of FIG. 6).

For easier understanding, the operations are summarized in Table 1 of FIG. 7.

Redundant boosting is eliminated by the above-mentioned operations and specifically the power consumption may be drastically lowered by lower frequency switching.

Figure 8:
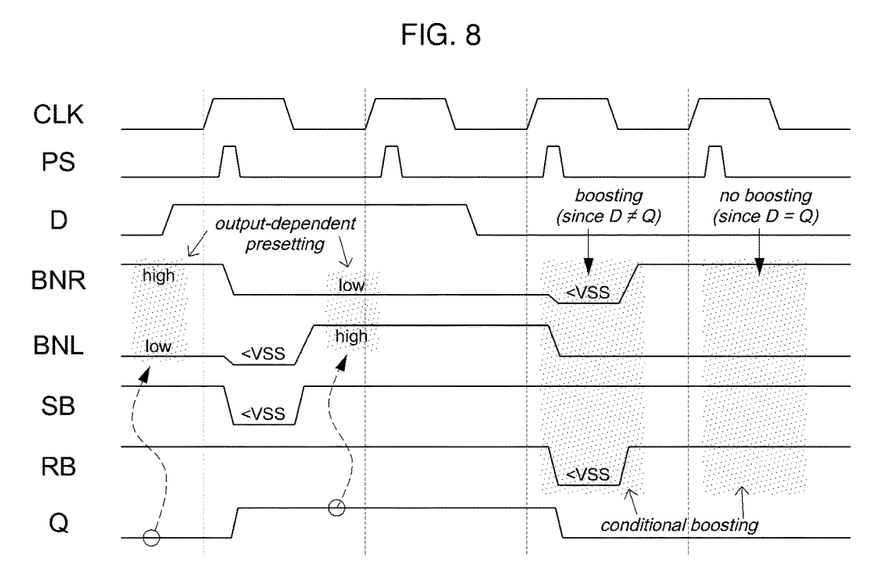
FIG. 8 is an example of a driving method of a flip-flop.

FIG. 8 is an example of a driving method of a flip-flop according to the present disclosure.

A driving method of a flip-flop 10 according to the present disclosure includes a step of pre-charging a boosting capacitor $C_{BOOT}$ in accordance with a previous output signal Q, a step of boosting a node connected to the boosting capacitor $C_{BOOT}$ when a level of the previous output signal Q and a level of a current input signal D are different, a step of generating a pulsed signal PS corresponding to transition of a clock signal CLK, and a step of latching the current input signal D to the current output signal Q in accordance with the pulsed signal PS.

Referring to FIG. 8, even though the previous output signal Q and the current output signal Q are denoted by the same referential character, the previous output signal and the current output signal may be distinguished as time periods with respect to the pulsed signal PS.

According to the embodiment, when a level of the previous output signal Q and a level of the current input signal D are the same, a node connected to the boosting capacitor $C_{BOOT}$ may not be boosted.

Hereinafter, a driving method of an exemplary flip-flop 10 will be described in detail with reference to an example of a timing diagram depicted in FIG. 8.

Prior to describing the driving method of the exemplary flip-flop 10, it is assumed that when the clock signal CLK is a low level, an initial output signal Q is set to be a low level.

Next, the node BNR is preset to a high level by turning on the transistors MP5 and MP7 and the node BNL is preset to a low level by turning on the transistor MN8 (output-dependent presetting). Now, when the pulsed signal PS becomes a high level after the rising edge of the clock signal CLK, the nodes BNL and BNR are connected to the nodes SB and RB or the first power supply voltage VSS in accordance with the input data.

As illustrated in a first cycle of FIG. 3, the input signal D is a high level, which is different from that of the output signal Q. Therefore, the voltage of the node BNR is pulled down to the second power supply voltage VSS through the transistors MN6 and MN7. Further, the voltage of the node BNL connected to the node SB through the transistors MN1 and MN3 becomes lower than the second power supply voltage VSS due to the capacitive coupling through the boosting capacitor $C_{BOOT}$ (input-dependent boosting).

Such an operation results in an improved driving force of the transistors MN1 and MN3 and fast pull-down of the node (SB) voltage. A slight forward body bias formed by a negative voltage at the node BNL reduces a threshold voltage $V_{TH}$ and improves a driving force.

Moreover, a negatively boosted voltage which is transmitted to the node SB causes the pMOS transistor in the first inverter I1 and the transistor MP8 of the latch 300 to have an improved driving force, which causes fast pull-up of the output signal Q.

Even though the boosted node SB is instantly floated after the pull-down of the pulsed signal PS, any possible rise of the node SB due to leakage does not cause output flipping. This is because the transistors MP13 and MN14 of the latch 300 are completely off. Due to this condition, this circuit is not appropriate for operating at a very low frequency.

Since at a next falling edge of the clock signal CLK, the inverted output signal QB is a low level, the node BNL is preset to a high level through the transistors MP5 and MP6, which presets the voltage of the node BNR to a low level through the transistor MN9 (output-dependent presetting). The node SB is also precharged to a high level due to the transistor MP3.

Now, an operation of a second cycle of FIG. 3 will be described. The input signal D is maintained to a high level, which is the same as the output signal Q.

When the pulsed signal PS becomes a high level after the rising edge of the clock signal CLK, the node BNL is connected to the node SB and the node BNR is connected to the first power supply voltage VSS. However, the nodes BNL and BNR are already a high level and a low level, respectively so that the boosting operation does not occur (input-dependent boosting), which does not cause the output change. In order to suppress a possible change due to the leakage, the nodes SB and RB are maintained to a high level by the transistors MP1 and MP2.

During a third cycle of FIG. 3, that is, while the output signal Q is a high level and the input signal D is a low level, the negative boosting is generated at the node BNR for fast pull-down of the output signal Q. In the meantime, during a fourth cycle when both the output signal Q and the input signal D are a low level, the boosting operation does not occur.

Figure 9:
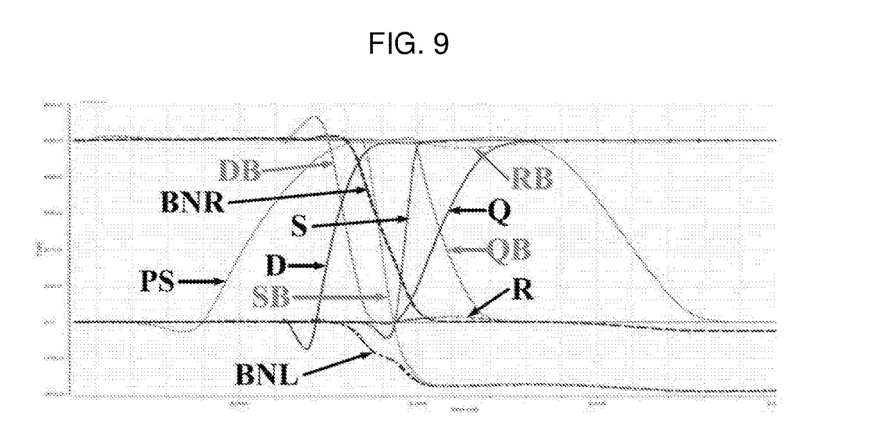
FIG. 9 is an example of a simulated waveform of a flip-flop.

FIG. 9 is an example of a simulated waveform of a flip-flop according to the present disclosure.

Referring to FIG. 9, it is confirmed that high level input data is quickly captured by the flip-flop 10 by boosting the node BNL below the ground level.

As seen from the above-described operation process, a latency of the proposed flip-flop 10 is considerably reduced by the voltage boosting which improves the driving force of the transistors. The enlarged gate-source voltage of the transistors located in timing-critical paths contributes to this feature. A slight forward source-body voltage is formed in some of transistors by boosting the source voltage below the ground level, which results in reducing the threshold voltage and further improving the driving force.

The increased gate-source voltage and the reduced threshold voltage mean improved effective voltages so that there is little latency change even in process variation, and the degree of performance change is reduced. Moreover, based on the suggested output-dependent presetting and input-dependent boosting technique, only when the stored data and input data are different, the boosting is generated, which results in a conditional boosting operation. Therefore, redundant boosting operation which consumes power is eliminated, which results in a substantially improved energy efficiency in low frequency switching operations.

A soft-edge property provided by a pulsed operation improves a resistance against a clock skew and a clock jitter and enables time-borrowing. Since the pulse may be shared by a plurality of flip-flops, the energy consumed by the pulse generator 200 may be reduced.

Even though the proposed flip-flop 10 is based on voltage boosting in which some internal node voltages exceed a supplied voltage, an overstress problem is not incurred. This is because an application target product targets a voltage action near the threshold, and the boosted maximum voltage still does not exceed 1 V.

Figure 10:
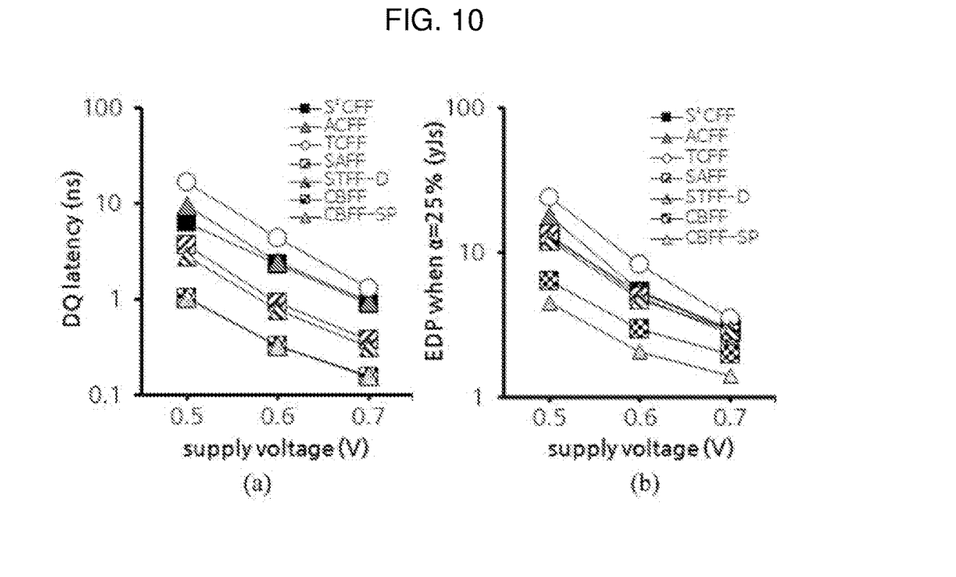
FIG. 10 is an example of a simulation result for various supply voltages.
Figure 11:
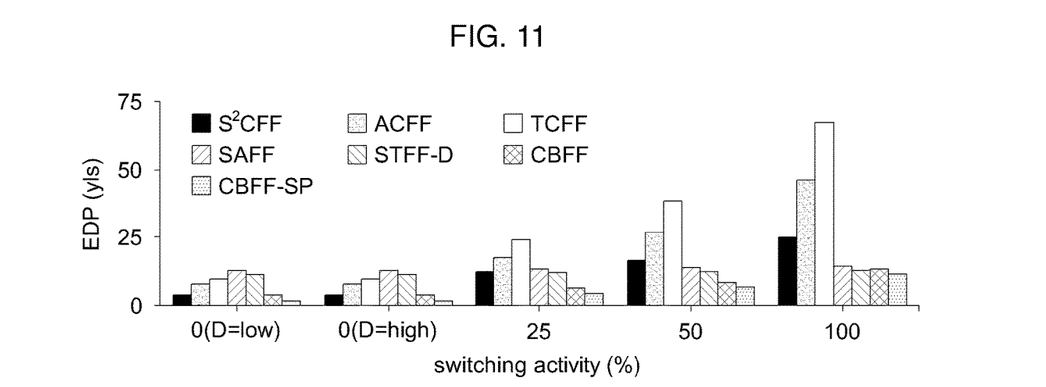
FIG. 11 is an example of an EDP simulated for various switching conditions.
Figure 12:
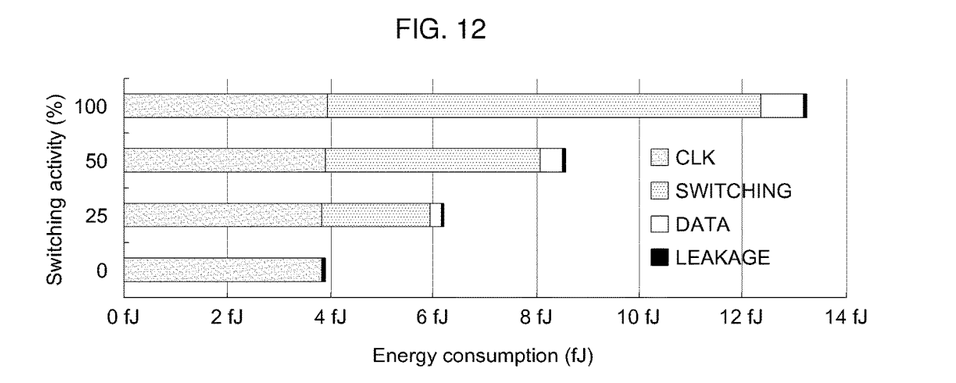
FIG. 12 is an example of a simulated energy of a CBFF for various switching conditions.

FIG. 10 is an example of a simulation result for various supplying voltages, FIG. 11 is an example of an EDP simulated for various switching conditions, and FIG. 12 is an example of a simulated energy of a CBFF for various switching conditions.

A sense amplifier-based flip-flop (SAFF), a differential skew tolerant flip-flop (STFF-D), a static contention-free single-phase-clocked flip-flop (SCFF), an adaptive-coupling flip-flop (ACFF), and fully static topologically-compressed flip-flop (TCFF) which were flop flops of the related art were designed by 65-nm CMOS process and evaluated as well as the CBFF which was a proposed flip-flop 10.

A CBFF with shared pulse generator (CBFF-SP) in which four proposed flip-flops 10 shared the pulse generator 200 was also designed and evaluated.

A size of each of the flip-flops was individually optimized and the EDP is minimized at each supplied voltage. A 15 fF of capacitive load was attached to each flip-flop at each output. An MOM capacitor was used to implement a boosting capacitor. A pulse width of the proposed flip-flop was chosen to give a sufficient margin to guarantee data capture even under worst conditions.

Referring to FIG. 10, a simulated data-to-output latency (DQ) and an energy-delay product (EDP) of the flip-flops at a supplied voltage of 0.5 to 0.7 V are illustrated.

As illustrated in FIG. 10, the CBFF is up to 72% and 63% faster than the SAFF and STFF-D at 25% switching activity (see FIG. 10A) and has up to 53% and 47% lower EDP than that of the SAFF and STFF-D (see FIG. 10B). Further since the pulse generator 200 is shared by the plurality of flip-flops, the CBFF-SP shows up to 67% and 63% lower EDD than that of the SAFF and STFF-D. S²CFF, ACFF, and TCFF have considerably large DQ latency, which causes a poor performance in terms of EDP.

Referring to FIG. 11, a simulated EDP of the flip-flops at a supply voltage of 0.5 V in accordance with an input switching activity is illustrated. Improved EDP of the CBFF and CBFF0SP with respect to the SAFF is up to 70% and 85%, respectively. This is caused by the conditional operation.

In FIG. 12, the power consumption of the proposed flip-flop 10 is divided for every component and with reference to this, it is understood that as the switching activity is reduced by the conditional boosting, the switching power is reduced. At the zero switching activity, most of power is consumed by the clock circuit included in the pulse generator 200.

Figure 13:
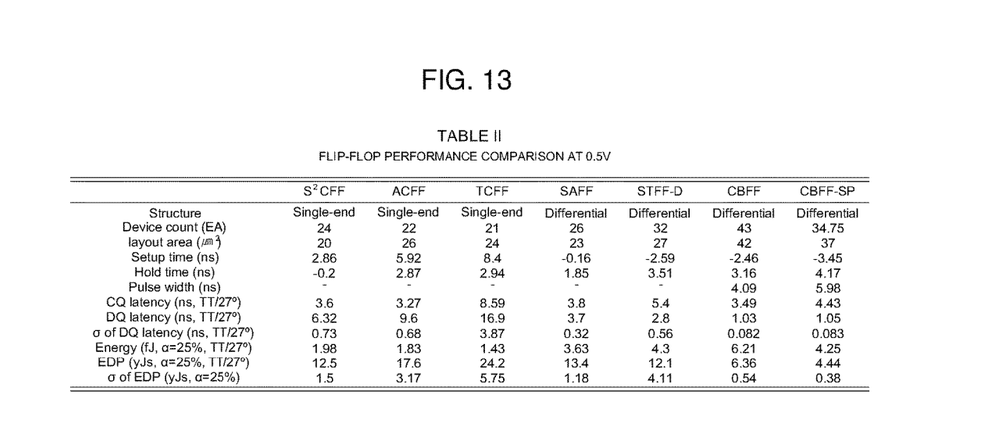
FIG. 13 is an example of a table for comparing performances of a flip-flop according to the present disclosure and a flip-flop of a related art.
Figure 14:
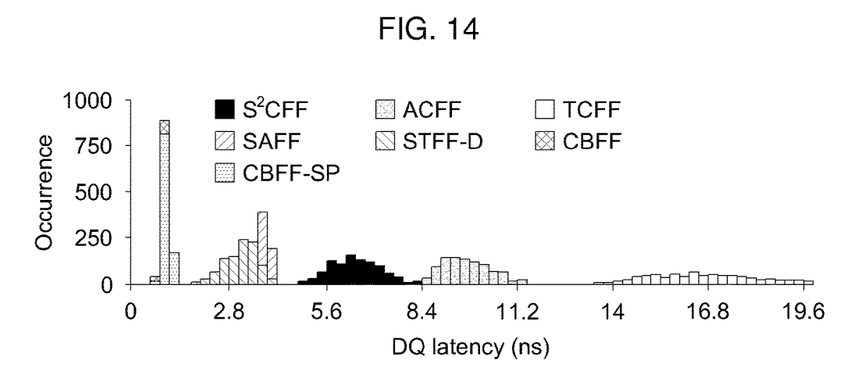
FIG. 14 is an example of a view for explaining a Monte Carlo simulation result for a DQ latency.

FIG. 13 is a table for comparing performances of a flip-flop according to the present disclosure and a flip-flop of a related art and FIG. 14 is a view for explaining a Monte Carlo simulation result for a DQ latency.

In FIG. 14, DQ latency changes of the flip-flops by 1000-point Monte Carlo simulation in a random process change are compared. Referring to this, it is understood that the DQ latencies of the CBFF and CBFF-SP are not sensitive to the process change in a near-threshold voltage region.

Specifically, the CBFF has 75% and 85% lower DQ latency standard variations than that of the SAFF and STFF-D. Further, the CBFF-SP has 67% and 87% reduced EDP standard variations as compared with the SAFF and STFF-D.

The performances of the flip-flops are summarized in Table 2 of FIG. 13. The proposed flip-flops use more devices and occupy a larger layout region. The S²CFF, ACFF, and TCFF are proposed for low power and thus consume lower energy, but have a larger DQ latency which causes poor EDP performance. The proposed flip-flop has a relatively high hold time due to the pulsed operation, which may require a buffer stage at an output side to avoid hold time violation. According to the evaluation, when a buffer stage for solving the above-mentioned issues is further included, approximately 7% EDP overhead may be caused at 25% switching activity.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A flip-flop, comprising:
a conditional boosting stage comprising a boosting capacitor, and configured to pre-charge the boosting capacitor in accordance with a previous output signal and boost a node connected to the boosting capacitor upon a level of the previous output signal being different from a level of a current input signal;
a pulse generator configured to generate a pulsed signal in accordance with transitions of a clock signal; and
a latch configured to latch the current input signal to a current output signal in accordance with the pulsed signal.

2. The flip-flop according to claim 1, wherein the conditional boosting stage further comprises:
a first transistor comprising a gate terminal, configured to receive the previous output signal, and one end connected to one end of the boosting capacitor;
a second transistor comprising a gate terminal, configured to receive an inverted previous output signal, and one end connected to the other end of the boosting capacitor;
a third transistor comprising a gate terminal, connected to one end of the boosting capacitor, one end connected to a first power supply voltage, and the other end connected to the other end of the boosting capacitor; and
a fourth transistor comprising a gate terminal, connected to the other end of the boosting capacitor, one end connected to the first power supply voltage, and the other end connected to one end of the boosting capacitor.

3. The flip-flop according to claim 2, wherein the conditional boosting stage further comprises:
a fifth transistor comprising a gate terminal, configured to receive the current input signal, and one end connected to one end of the boosting capacitor; and
a sixth transistor comprising a gate terminal, configured to receive an inverted current input signal, and one end connected to the other end of the boosting capacitor.

4. The flip-flop according to claim 3, wherein the conditional boosting stage further comprises:
a seventh transistor comprising a gate terminal, configured to receive a clock signal, one end is connected to the other end of the first transistor, and the other end is connected to a second power supply voltage; and
an eighth transistor comprising a gate terminal, configured to receive the pulsed signal, one end connected to the other end of the fifth transistor, and the other end connected to the first power supply voltage.

5. The flip-flop according to claim 4, wherein the conditional boosting stage further comprises:
a ninth transistor comprising a gate terminal, configured to receive the current input signal, and one end connected to the other end of the boosting capacitor;
a tenth transistor comprising a gate terminal, configured to receive the pulsed signal, and one end connected to the other end of the ninth transistor;
an eleventh transistor comprising a gate terminal, configured to receive the clock signal, one end connected to the other end of the tenth transistor and the other end connected to the second power supply voltage;
a twelfth transistor in which one end is connected to the other end of the tenth transistor and the other end is connected to the second power supply voltage; and
a first inverter in which one end is connected to the other end of the tenth transistor and the other end is connected to a gate terminal of the twelfth transistor.

6. The flip-flop according to claim 5, wherein the conditional boosting stage further comprises:
a thirteenth transistor comprising a gate terminal, configured to receive the inverted current input signal, and one end connected to one end of the boosting capacitor;

a fourteenth transistor comprising a gate terminal, configured to receive the pulsed signal, and one end connected to the other end of the thirteenth transistor;

a fifteenth transistor comprising a gate terminal, configured to receive the clock signal, one end connected to the other end of the fourteenth transistor and the other end connected to the second power supply voltage;

a sixteenth transistor in which one end is connected to the other end of the fourteenth transistor and the other end is connected to the second power supply voltage; and a second inverter in which one end is connected to the other end of the fourteenth transistor and the other end is connected to a gate terminal of the sixteenth transistor.

7. The flip-flop according to claim 6, wherein the latch comprises:

a seventeenth transistor comprising a gate terminal, connected to the other end of the tenth transistor, and one end connected to the second power supply voltage;

an eighteenth transistor comprising a gate terminal, connected to the gate terminal of the sixteenth transistor, one end connected to the other end of the seventeenth transistor, and the other end connected to the first power supply voltage;

a nineteenth transistor comprising a gate terminal, connected to the other end of the fourteenth transistor, and one end connected to the second power supply voltage; and a twentieth transistor comprising a gate terminal, connected to the gate terminal of the twelfth transistor, one end connected to the other end of the nineteenth transistor, and the other end connected to the first power supply voltage.

8. The flip-flop according to claim 7, wherein the latch further comprises:

a twenty-first transistor comprising a gate terminal, connected to the gate terminal of the sixteenth transistor, and one end connected to the second power supply voltage;

a twenty-second transistor comprising a gate terminal, connected to the other end of the nineteenth transistor, one end connected to the other end of the twenty-first transistor, and the other end connected to the other end of the seventeenth transistor;

a twenty-third transistor comprising a gate terminal, connected to the other end of the nineteenth transistor, and one end connected to the other end of the twenty-second transistor; and a twenty-fourth transistor comprising a gate terminal, connected to the other end of the tenth transistor, one end connected to the other end of the twenty-third transistor, and the other end connected to the first power supply voltage.

9. The flip-flop according to claim 8, wherein the latch further comprises:

a twenty-fifth transistor comprising a gate terminal, connected to the gate terminal of the twelfth transistor, and one end connected to the second power supply voltage;

a twenty-sixth transistor comprising a gate terminal, connected to the other end of the seventeenth transistor, one end connected to the other end of the twenty-fifth transistor, and the other end connected to the other end of the nineteenth transistor;

a twenty-seventh transistor comprising a gate terminal, connected to the other end of the seventeenth transistor, and one end connected to the other end of the nineteenth transistor; and a twenty-eighth transistor comprising a gate terminal, connected to the other end of the fourteenth transistor, one end connected to the other end of the twenty-seventh transistor, and the other end connected to the first power supply voltage.

10. The flip-flop according to claim 6, wherein the pulse generator comprises:

a third inverter in which one end is configured to receive the clock signal;

a fourth inverter in which one end is connected to the other end of the third inverter;

a fifth inverter in which one end is connected to the other end of the fourth inverter;

a twenty-ninth transistor comprising a gate terminal, connected to the other end of the fifth inverter, and one end connected to the second power supply voltage; and a sixth inverter in which one end is connected to the other end of the twenty-ninth transistor and the pulsed signal is output through the other end.

11. The flip-flop according to claim 10, wherein the pulse generator further comprises:

a thirtieth transistor comprising a gate terminal, connected to the other end of the fifth inverter, one end connected to the other end of the third inverter, and the other end connected to one end of the sixth inverter; and a thirty-first transistor comprising a gate terminal, connected to the other end of the fourth inverter, one end connected to the other end of the third inverter, and the other end connected to one end of the sixth inverter.

12. A driving method of a flip-flop, the driving method comprising:

pre-charging a boosting capacitor in accordance with a previous output signal;

boosting a node connected to the boosting capacitor upon a level of the previous output signal being different from a level of a current input signal;

generating a pulsed signal in accordance with transitions of a clock signal; and latching the current input signal to a current output signal in accordance with the pulsed signal.

13. The driving method according to claim 12, wherein a node connected to the boosting capacitor is not boosted when the level of the previous output signal is the same as the level of a current input signal.

* * * * *